(12) United States Patent
Matsuda et al.

(10) Patent No.: US 10,566,966 B2
(45) Date of Patent: Feb. 18, 2020

(54) SEMICONDUCTOR DEVICE AND OSCILLATION SUPPRESSING DEVICE

(71) Applicant: FUJI ELECTRIC CO., LTD., Kanagawa (JP)

(72) Inventors: Naotaka Matsuda, Mitaka (JP); Seiki Igarashi, Saitama (JP); Hideaki Kakiki, Matsumoto (JP); Susumu Iwamoto, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/016,679

(22) Filed: Jun. 25, 2018

(65) Prior Publication Data

US 2018/0309438 A1 Oct. 25, 2018

Related U.S. Application Data

(63) Continuation of application No. PCT/JP2017/019365, filed on May 24, 2017.

(30) Foreign Application Priority Data

Jul. 11, 2016 (JP) .................................. 2016-136827

(51) Int. Cl.
*H01L 25/16* (2006.01)
*H03K 17/0814* (2006.01)
(Continued)

(52) U.S. Cl.
CPC ..... *H03K 17/08142* (2013.01); *H01L 25/162* (2013.01); *H01L 29/1608* (2013.01);
(Continued)

(58) Field of Classification Search
CPC ............ H03K 17/08142; H03K 17/162; H01L 25/07; H01L 25/162; H01L 25/18; H01L 29/1608; H01L 29/861
(Continued)

(56) References Cited

U.S. PATENT DOCUMENTS 6,215,679 B1 * 4/2001 Yamane ................ H02M 7/003
257/E25.029
2003/0030058 A1 2/2003 Satoh
(Continued)

FOREIGN PATENT DOCUMENTS

CN 101228630 A 7/2008
CN 103915995 A 7/2014
(Continued)

OTHER PUBLICATIONS

International Search Report for International Patent Application No. PCT/JP2017/019365, issued by the Japan Patent Office dated Jul. 25, 2017.
(Continued)

*Primary Examiner* — Tomi Skibinski

(57) ABSTRACT

A semiconductor device of the present invention suppresses high frequency noise caused in a semiconductor device incorporating SiC elements. The semiconductor device includes semiconductor elements connected in series, a SiC diode element connected in parallel to the semiconductor element, and an oscillation suppressing circuit being connected in parallel to the semiconductor element and the SiC diode element and suppressing voltage fluctuation caused in the SiC diode element in response to turn-ons of the semiconductor element. The oscillation suppressing circuit suppresses voltage fluctuation caused in the SiC diode element in response to turn-ons of the semiconductor element thereby improving reliability of the semiconductor device.

15 Claims, 7 Drawing Sheets

(51) Int. Cl.
  *H02M 1/34* (2007.01)
  *H01L 29/16* (2006.01)
  *H01L 29/861* (2006.01)
(52) U.S. Cl.
  CPC ............ *H01L 29/861* (2013.01); *H02M 1/34* (2013.01); *H02M 2001/348* (2013.01)
(58) Field of Classification Search
  USPC ...... 327/389, 564–566; 363/131, 132, 56.01, 363/37, 126
  See application file for complete search history.

(56) References Cited

U.S. PATENT DOCUMENTS

| | | | |
|---|---|---|---|
| 2009/0057416 A1 | 3/2009 | Kato | |
| 2009/0168471 A1 | 7/2009 | Tsugawa et al. | |
| 2012/0106220 A1* | 5/2012 | Yamaguchi | H05K 7/209 363/131 |
| 2014/0321171 A1* | 10/2014 | Fujita | H02M 1/14 363/37 |
| 2015/0138733 A1* | 5/2015 | Tsuda | H01L 25/115 361/733 |

FOREIGN PATENT DOCUMENTS

| | | | | |
|---|---|---|---|---|
| CN | 105391028 A | | 3/2016 | |
| JP | S6091867 A | | 5/1985 | |
| JP | 2003051602 A | | 2/2003 | |
| JP | 2009159184 A | | 7/2009 | |
| JP | 2014128066 A | * | 7/2014 | ............ H01L 24/36 |
| JP | 2014128066 A | | 7/2014 | |
| WO | WO2013132827 A1 | | 9/2013 | |

OTHER PUBLICATIONS

Fairchild Semiconductor Corporation, [AN-4160 FTCO3V455A1 3-Phase Inverter Automotive Power Module], Rev-1.0.0, Nov. 8, 2013, p. 1-p. 8.

Mitsubishi Electric Corporation, [IGBT Modules 6.1th Gen.S1 Series NX Type/6th Gen. S Series NX Type/5th Gen. NX Series Application Note], CMH-10152-B, Ver.1.2, Dec. 2014, p. 14.

Office Action issued for counterpart Chinese Application 201780005091. X, issued by the China National Intellectual Property Administration dated Sep. 4, 2019.

* cited by examiner

SEMICONDUCTOR DEVICE AND OSCILLATION SUPPRESSING DEVICE

The contents of the following Japanese patent applications are incorporated herein by reference:
2016-136827 filed in JP on Jul. 11, 2016
PCT/JP2017/019365 filed on May 24, 2017

BACKGROUND

1. Technical Field

The present invention relates to a semiconductor device and an oscillation suppressing device.

2. Related Art

As an example of semiconductor devices, a switch device which is configured by connecting a rectifier element such as schottky barrier diodes (SBDs) and the like in anti-parallel to a switch element such as insulated gate bipolar transistors (IGBTs), metal-oxide-semiconductor field-effect transistors (MOSFETs) and the like or a device which is configured by serially connecting two of the switch devices is incorporated in a power conversion system such as power conditioning systems (PCSs), inverters, and smart grids. In these systems, during turn-ons or turn-offs of the switch elements in the semiconductor device or during reverse recovery of the rectifier elements, sudden current changes (di/dt) may cause surge voltage (Ldi/dt) in a wiring inductance (L) in the device resulting in leakage of high frequency noise such as, for example, 10 kHz or less into the other devices in the system.

As such, Patent Document 1, for example, discloses a semiconductor device in which a snubber circuit is connected between two terminals electrically connected to the main circuit in the semiconductor device and exposed to the exterior. For the snubber circuit, an RC snubber which is configured by serially connecting a resistor element and a capacitor element is adopted. The RC snubber can absorb high frequency noise due to surge voltage thus preventing the leakage to the outside of the device.

[Patent Document] Patent Document 1: Japanese Patent Application Publication No. 2014-128066

In recent years, power semiconductor devices (hereinafter referred to as semiconductor devices for short) incorporating next-generation semiconductor elements such as compound semiconductor elements including silicon carbide (SiC) compound semiconductor elements and the like have been developed. Compared to the conventional silicon (Si) semiconductor elements, the SiC element is more highly pressure-resistant due to its high dielectric breakdown field, and also achieves a higher impurity concentration and a thinner active layer, thus enabling a small semiconductor device capable of operating highly efficiently and fast. However, the ability of such a semiconductor element to operate fast may cause high frequency noise that cannot be solved (or suppressed) by conventional RC snubbers or C snubbers.

SUMMARY (Item 1)

A semiconductor device may comprise a first semiconductor element and a second semiconductor element connected in series. The semiconductor device may comprise a first SiC diode element connected in parallel to the first semiconductor element. The semiconductor device may comprise a first oscillation suppressing circuit connected in parallel to the first semiconductor element and the first SiC diode element, the first oscillation suppressing circuit suppressing voltage fluctuation caused in the first SiC diode element in response to turn-ons of the second semiconductor element.

(Item 2)

The semiconductor device may further comprise a second SiC diode element connected in parallel to the second semiconductor element.

(Item 3)

The first oscillation suppressing circuit may include a resistor and a capacitor connected in series.

(Item 4)

The first oscillation suppressing circuit may suppress a voltage fluctuation of 10 MHz or more.

(Item 5)

The first oscillation suppressing circuit may suppress a voltage fluctuation in a range of 1 MHz to 100 MHz.

(Item 6)

The capacitor may have a capacitance of 100 nF or less.

(Item 7)

The capacitor may have a capacitance in a range of 1 nF to 20 nF.

(Item 8)

At least one of the resistor and the capacitor of the first oscillation suppressing circuit may be resilient.

(Item 9)

The semiconductor device may further comprise a housing for housing the first semiconductor element, the second semiconductor element, the first SiC diode element, and the second SiC diode element. The housing may comprise a first terminal housing section housing a first terminal to be connected to a first external terminal, the first terminal being connected to the first semiconductor element at opposite side from the second semiconductor element, the first terminal housing section protruding from a main body part of the housing, and a second terminal housing section housing a second terminal to be connected to a second external terminal, the second terminal being connected between the first semiconductor element and the second semiconductor element or the second terminal being connected to the second semiconductor element at opposite side from the first semiconductor element, the second terminal housing section protruding from the main body part of the housing.

(Item 10)

The first oscillation suppressing circuit may be mounted on surfaces in the first terminal housing section and the second terminal housing section, the surfaces where the first external terminal and the second external terminal are connected.

(Item 11)

The first oscillation suppressing circuit may be screwed together with the first external terminal with respect to the first terminal in the first terminal housing section and may be screwed together with the second external terminal with respect to the second terminal in the second terminal housing section.

(Item 12)

The first oscillation suppressing circuit may be mounted on a side surface laterally positioned with respect to surfaces in the first terminal housing section and the second terminal housing section, the surfaces where the first external terminal and the second external terminal are connected.

(Item 13)

The first oscillation suppressing circuit may include an additional substrate to be attached to the housing from the outside of the housing. The additional substrate may be fixed to the first terminal housing section and the second terminal housing section.

(Item 14)

The additional substrate may include a first portion substrate and a second portion substrate separated from each other. The first oscillation suppressing circuit may include a resistor and a capacitor connected in series, at least one of the resistor and the capacitor being resilient and being provided to straddle between the first portion substrate and the second portion substrate.

(Item 15)

The first oscillation suppressing circuit may be connected between the first terminal connected to the first semiconductor element at opposite side from the second semiconductor element and the second terminal connected between the first semiconductor element and the second semiconductor element.

(Item 16)

The semiconductor device may further comprise a second oscillation suppressing circuit provided between a third terminal connected to the second semiconductor element at opposite side from the second terminal and the second terminal, the second oscillation suppressing circuit suppressing voltage fluctuation caused in the second SiC diode element in response to turn-ons of the first semiconductor element.

(Item 17)

The first oscillation suppressing circuit may be provided between a first terminal connected to the first semiconductor element at opposite side from the second semiconductor element and a second terminal connected to the second semiconductor element at opposite side from the first semiconductor element.

(Item 18)

The semiconductor device may further comprise an RC snubber circuit connected in parallel to the first semiconductor element, the first SiC diode element and the first oscillation suppressing circuit.

(Item 19)

The RC snubber circuit may include a capacitor having a capacitance in a range of 400 nF to 10 μF.

(Item 20)

An oscillation suppressing device to be attached to a semiconductor device comprising a first and second semiconductor elements connected in series and a first SiC diode element connected in parallel to the first semiconductor element may be attached to the housing of the semiconductor device and connected in parallel to the first semiconductor element and the first SiC diode element thereby suppressing voltage fluctuation caused in the first SiC diode element in response to turn-ons of the second semiconductor element.

(Item 21)

The oscillation suppressing circuit may include a resistor and a capacitor connected in series, the resistor and the capacitor being connected in parallel to the first semiconductor element and the first SiC diode element.

(Item 22)

The housing may comprise a first terminal housing section housing a first terminal to be connected to a first external terminal, the first terminal being provided to the first semiconductor element at opposite side from the second semiconductor element, the first terminal housing section protruding from a main body part of the housing, and a second terminal housing section housing a second terminal to be connected to a second external terminal, the second terminal being provided between the first semiconductor element and the second semiconductor element or the second terminal being provided to the second semiconductor element at opposite side from the first semiconductor element, the second terminal housing section protruding from the main body part of the housing. The oscillation suppressing device may be mounted on surfaces in the first terminal housing section and the second terminal housing section, the surfaces where the first external terminal and the second external terminal are connected or a side surface laterally positioned with respect to surfaces in the first terminal housing section and the second terminal housing section, the surfaces where the first external terminal and the second external terminal are connected.

The above-mentioned summary of the invention does not list all the features of the present invention. The invention may also reside in a sub-combination of the features.

DESCRIPTION OF EXEMPLARY EMBODIMENTS

Herebelow, the present invention shall be explained by means of embodiments of the invention, but the following embodiments should not be considered to limit the invention of the claims Moreover, all the features of the combinations described in the embodiments are not necessarily essential as means for solving the problems of the invention.

Figure 1A:
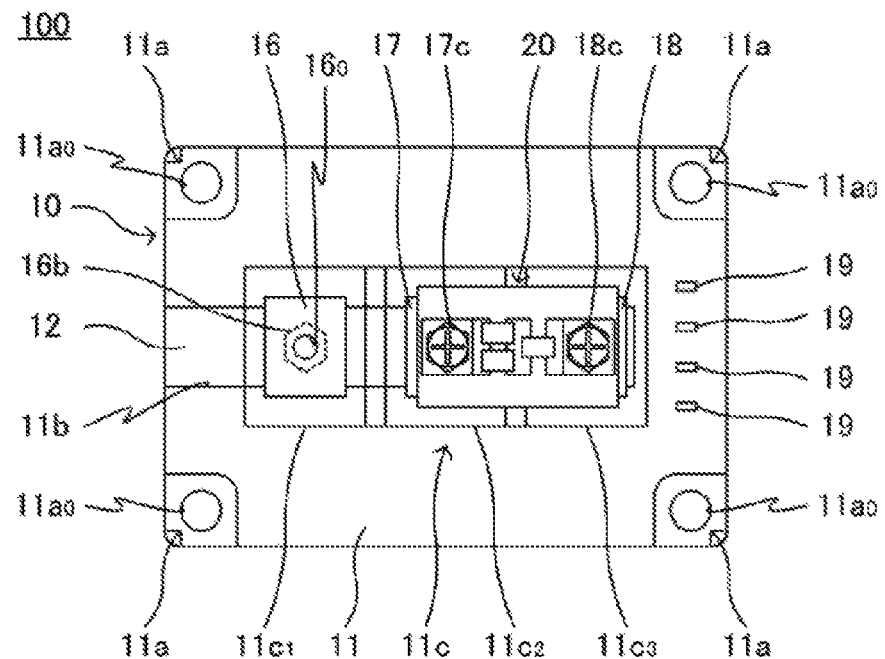
FIG. 1A shows a configuration of the semiconductor device in a view from the top.
Figure 1B:
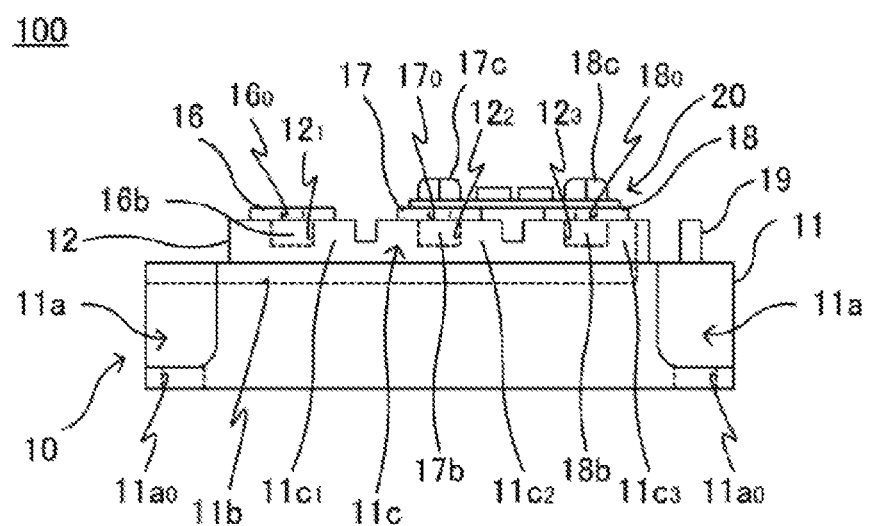
FIG. 1B shows a configuration of the semiconductor device in a view from the side.
Figure 2:
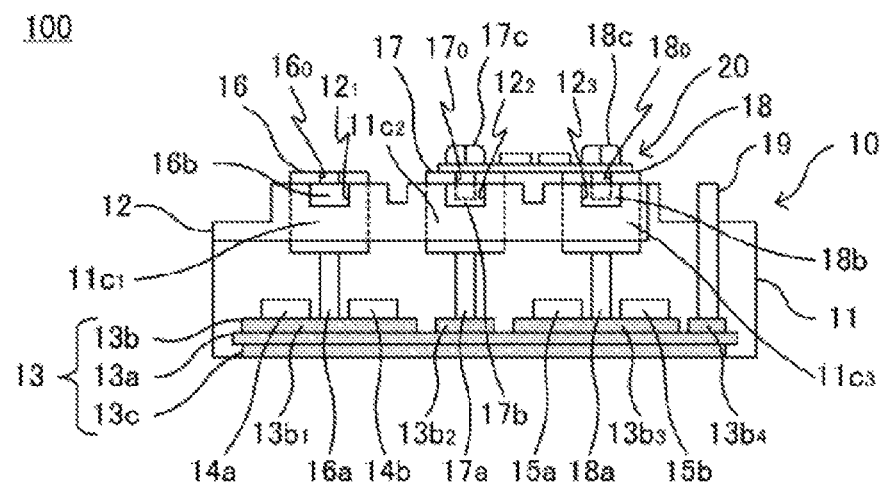
FIG. 2 shows an internal configuration of the semiconductor device.

FIGS. 1A, 1B and 2 show a configuration of the semiconductor device 100 in a view from the top, a configuration of the semiconductor device in a view from the side, and an internal configuration of the semiconductor device, respectively, according to this embodiment. Herein, the upward and downward direction of FIG. 1A and the depth direction extending forward in the direction orthogonal to the planes of FIGS. 1B and 2 are referred to the vertical direction. The rightward and leftward direction of FIGS. 1A, 1B and 2 are referred to the horizontal direction. The depth direction extending forward in the direction orthogonal to the plane of FIG. 1A and the upward and downward direction of FIGS. 1B and 2 are referred to the height direction. The object of the semiconductor device 100 is to suppress high frequency noise which may happen during turn-ons of switch elements by incorporating an oscillation suppressing circuit, and preferably, to further configure a highly reliable oscillation suppressing circuit in terms of stress resistance such as heat stress.

The semiconductor device 100 includes a housing 10, a substrate 13, semiconductor elements 14a and 15a, SiC diode elements 14b and 15b, external terminals 16 to 18, conductive parts 16a to 18a, an external terminal 19, and an oscillation suppressing circuit 20.

Unless otherwise specifically stated, references in this specification to "connection" shall include the meaning of electrically energizable connection.

The housing 10 is a member for sealing each constituent element of the semiconductor device 100 therein with the top end of the external terminal 19 protruding and the lower surface of the substrate 13 being exposed flush with the bottom surface of the housing 10, and for fixing the external terminals 16 to 18 with their respective upper surfaces being exposed to the top surface of the housing 10. The housing 10 includes a main body 11 and a terminal housing chamber 12, which are formed by molding a thermosetting resin such as, for example, an epoxy resin.

Instead of molding, the housing 10 may seal each constituent element of the semiconductor device 100 by filling a gel filler such as silicone gel in the interior space. Also, in addition to sealing the constituent elements inside the housing 10 while exposing the lower surface of the substrate 13 from the bottom surface of the housing 10, by bonding the substrate 13 onto a plate-like base member of metal material such as, for example, copper using a bonding material such as solder and then fixing a frame onto the periphery of the base member using an adhesive and the like so as to have the housing 10 with the base member on its bottom surface, the housing 10 as such may seal each constituent element therein. Accordingly, heat caused by semiconductor elements mentioned below is exhausted to a member, i.e., a heat sink to which the semiconductor device 100 is mounted via the substrate 13 and the base member.

The main body 11 has a substantially rectangular parallelepiped where one axial direction (i.e., horizontal direction) is the longitudinal direction and a substantially rectangular parallelepiped-shaped protrusion 11c that protrudes upwardly from the middle of the upper surface of the substantially rectangular parallelepiped. In the upper surface of the main body 11, a recess 11b extending in the middle of the protrusion 11c in the leftward direction of the figure in a view from the top is formed. In the recess 11b, the terminal housing chamber 12 mentioned below may be inserted. Moreover, the main body 11 has substantially square-shaped stepped sections 11a at the four corners in a view from the top, and each stepped section 11a has a through-hole $11a_0$ formed thereon which extends through in the height direction. The semiconductor device 100 can be fixed to external devices by inserting fittings such as a bolt into the through-holes $11a_0$ from above.

Together with the terminal housing chamber 12 inserted in the recess 11b, the protrusion 11c constitutes a plurality of terminal housing sections $11c_1$ to $11c_3$ successively connected in one axial direction via grooves. The protrusion 11c houses the respective external terminals 16 to 18 described below in the positions corresponding to the three terminal housing sections $11c_1$ to $11c_3$ within the recess 11b. However, the external terminals 16 to 18 are U-shaped in a view from the side and have openings $16_0$ to $18_0$ formed in the middles of the upper surfaces, and the external terminals 16 to 18 are placed in the recess 11b with the upper surfaces of the external terminals 16 to 18 directed upward and the open ends of U-shape directed toward one side in the vertical direction such that the terminal housing chamber 12 can be inserted in the horizontal direction inside the external terminals 16 to 18.

The terminal housing chamber 12 is a member for housing terminals 16b to 18b and fixing the external terminals 16 to 18. The terminal housing chamber 12 has three bumps successively connected in one axial direction via grooves, corresponding to the three terminal housing sections $11c_1$ to $11c_3$, on the flat plate of the same shape as the recess 11b of the main body 11, i.e., where one axial direction is the longitudinal direction. In the respective middles of the upper surfaces of the three bumps, openings $12_1$ to $12_3$ of hexagonal-shape, for example, in a view from the top are formed, and as an example of the terminals 16b to 18b, respective nuts of the same shape are housed therein, with their female threads being directed toward the height direction.

A plurality of terminal housing sections $11c_1$ to $11c_3$ (three terminal housing sections, as an example in this embodiment) is configured by inserting the above-described terminal housing chamber 12 into the recess 11b of the main body 11 in the right direction of the figure internally through each of the external terminals 16 to 18 housed in the recess 11b. At this time, the female threads of the terminals 16b to 18b (i.e., the nuts) housed in the terminal housing chamber 12 are positioned in the vertical and horizontal directions so that they communicate with the openings $16_0$ to $18_0$ of the external terminals 16 to 18 in the height direction. Accordingly, bolts 17c and 18c, as an example of fittings, may be threaded into the female threads of the terminals 16b to 18b through the openings $16_0$ to $18_0$ of the external terminals 16 to 18 via an additional substrate 21 of the oscillation suppressing circuit 20 below described and a conductive plate (not shown) for connecting to other semiconductor devices and the like to thereby detachably connect the additional substrate 21 and the conductive plate to the external terminals 16 to 18 and also removably fix them to the housing 10.

The substrate 13 is a flat plate-like member on which semiconductor elements and the like are mounted, and, for example, Direct Copper Bonding (DCB) substrates, Active Metal Brazing (AMB) substrates and the like can be adopted. The substrate 13 includes an insulating plate 13a and circuit layers 13b and 13c. The insulating plate 13a is a plate-like member comprising an insulating ceramic such as, for example, an aluminum nitride, silicon nitride, and aluminum oxide. For the circuit layers 13b and 13c, a conductive metal such as, for example, copper, aluminum and the like is used, and the circuit layers 13b and 13c are provided on the lower and upper surfaces of the insulating plate 13a, respectively. Also, the circuit layer 13b includes wiring patterns $13b_1$ to $13b_4$ connecting to the semiconductor elements and/or the conductive parts.

The semiconductor elements 14a and 15a are an example of a first and a second semiconductor elements (may also be an example of a second and a first semiconductor elements), respectively, and are switch elements made of a compound semiconductor such as, for example, SiC, etc. For this, vertical metal-oxide-semiconductor field-effect transistors (MOSFETs), insulated gate bipolar transistor (IGBTs) and the like having electrodes on both the front and rear surfaces can be adopted. Moreover, instead of vertical elements, the semiconductor elements 14a and 15a may be horizontal elements having the electrodes provided only on the front surface. The semiconductor elements 14a and 15a are mounted on the wiring patterns $13b_1$ and $13b_3$ on the substrate 13, respectively.

In the case of IGBTs (or MOSFETs), the semiconductor elements 14a and 15a have emitter electrodes (a source electrode) and gate electrodes on the front surfaces, respectively and collector electrodes (a drain electrode) on the rear surfaces. The semiconductor elements 14a and 15a are fixed on the substrate 13 by bonding the rear surfaces to the wiring patterns $13b_1$ and $13b_3$, respectively using a bonding material such as solder, etc.

The SiC diode elements 14b and 15b are an example of a first and a second SiC diode elements (can also be an example of a second and a first SiC diode elements), respectively and are rectifier elements made of SiC. For this, as an example, vertical schottky barrier diodes (SBDs) having electrodes on both the front and rear surfaces can be adopted. Instead of vertical elements, the SiC diode elements 14b and 15b may be horizontal elements having the electrodes provided only on the front surface. The SiC diode elements 14b and 15b are mounted on the wiring patterns $13b_1$ and $13b_3$ on the substrate 13, respectively.

The SiC diode elements 14b and 15b have anode electrodes on the front surfaces and cathode electrodes on the rear surfaces. The SiC diode elements 14b and 15b are fixed on the substrate 13 by bonding the rear surfaces to the wiring patterns $13b_1$ and $13b_3$, respectively using a bonding material such as solder, etc. Accordingly, the cathode electrodes of the SiC diode elements 14b and 15b are connected to the collector electrodes of the semiconductor elements 14a and 15a, respectively.

Also, the anode electrodes of the SiC diode elements 14b and 15b are connected to the emitter electrodes of the semiconductor elements 14a and 15a, respectively using wires (not shown) of conductive metal such as, for example, copper, aluminum and the like or conductive alloy such as iron aluminum alloy, etc. Accordingly, the SiC diode elements 14b and 15b are connected in anti-parallel to the semiconductor elements 14a and 15a, respectively thereby configuring a switching device. Moreover, the emitter electrode of the semiconductor element 15a is connected to the wiring pattern $13b_1$ on the substrate 13 using wires (not shown). Accordingly, the semiconductor element 15a and the SiC diode element 15b which are connected in anti-parallel are connected in series to the semiconductor element 14a and the SiC diode element 14b which are connected in anti-parallel. Furthermore, the anode electrode of the SiC diode element 14b is further connected to the wiring pattern $13b_2$ on the substrate 13 using wires (not shown), and the gate electrodes of the semiconductor elements 14a and 15a are connected to the wiring pattern $13b_4$ on the substrate 13 using wires (not shown).

The external terminals 16 to 18 are a terminal for conducting and outputting current output by the semiconductor elements 14a and 15a to outside the semiconductor device 100, and they are formed by deforming a plate-like member of conductive metal such as, for example, copper, aluminum and the like into a U-shape in a view from the side. As described earlier, the external terminals 16 to 18 have the respective openings $16_0$ to $18_0$ formed on the middles of the upper surfaces, and are placed in the positions corresponding to the three terminal housing sections $11c_1$ to $11c_3$ in the recess 11b of the housing 10.

The conductive parts 16a to 18a are a conductive member, which are provided between the wiring patterns $13b_1$ to $13b_3$ on the substrate 13 and the external terminals 16 to 18, respectively for carrying current output by the semiconductor elements 14a and 15a therebetween. As an example, a conductive metal such as copper, aluminum and the like is formed in a tabular or cylindrical shape.

The conductive parts 16a to 18a are erected on the substrate 13 by bonding the respective lower ends to the wiring patterns $13b_1$ to $13b_3$ using a bonding material such as solder, etc. or by ultrasonic bonding. And the respective upper ends of the conductive parts 16a to 18a are connected to the lower surfaces of the external terminals 16 to 18 by soldering, brazing, or caulking. The conductive part 16a enables the collector electrode of the semiconductor element 14a, the cathode electrode of the SiC diode element 14b, the emitter electrode of the semiconductor element 15a and the anode electrode of the SiC diode element 15b to be connected to the external terminal 16 via the wiring pattern $13b_1$, wires (not shown), and the terminal 16b. The conductive part 17a enables the emitter electrode of the semiconductor element 14a and the anode electrode of the SiC diode element 14b to be connected to the external terminal 17 via the wiring pattern $13b_2$, wires (not shown) and the terminal 17b. The conductive part 18a enables the collector electrode of the semiconductor element 15a and the cathode electrode of the SiC diode element 15b to be connected to the external terminal 18 via the wiring pattern $13b_3$ and the terminal 18b.

The external terminal 19 is a terminal for inputting control signals to the semiconductor elements 14a and 15a from outside the semiconductor device 100 and also for outputting output signals of the semiconductor elements 14a and 15a to outside the semiconductor device 100. For the external terminal 19, a conductive metal such as, for example, copper, aluminum, and the like is formed in a tabular shape where the height direction is the longitudinal direction. The external terminal 19 includes four terminals and is erected on the wiring pattern $13b_4$ of the substrate 13, protruding from the top surface of the housing 10. Moreover, the wiring pattern $13b_4$ is connected to the gate electrodes and the emitter electrodes of the semiconductor elements 14a and 15a via wires (not shown). Two terminals of the external terminal 19 are connected to the gate electrodes of the semiconductor elements 14a and 15a via the wiring pattern $13b_4$ and wires (not shown) to function as gate terminals. Also, the remaining two terminals of the external terminal 19 are connected to the emitter electrodes of the semiconductor elements 14a and 15a via the wiring pattern $13b_4$ and wires (not shown) to function as emitter terminals.

Figure 3A:
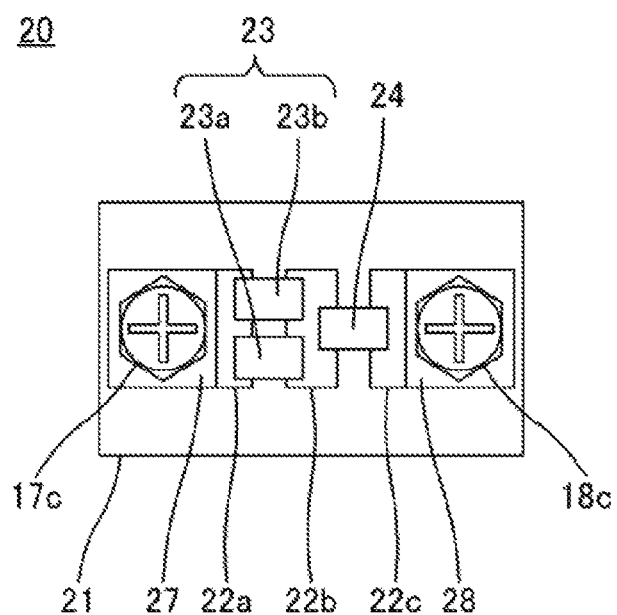
FIG. 3A shows a configuration of the oscillation suppressing circuit.

FIG. 3A shows a configuration of the oscillation suppressing circuit 20 in a view from the top. In the semiconductor device 100 incorporating SiC elements like SiC-SBD and the like, due to its high-speed operation, high frequency noise may happen, especially during turn-ons. Due to junction capacitance of the SiC-SBD, the noise is higher frequency, for example, in the range of 10 MHz to 20 MHz, so the noise may pass through and leak outside the device while very little of parasitic capacitance in the device is being attenuated. The oscillation suppressing circuit 20 suppresses such high frequency noise, i.e., voltage fluctuation in the SiC diode element 14b caused in response to turn-ons of the semiconductor element 15a and/or voltage fluctuation (for example, high frequency noise) in the SiC diode element 15b caused in response to turn-ons of the semiconductor element 14a. The oscillation suppressing circuit 20 has the additional substrate 21, a resistor 23, and a capacitor 24.

The additional substrate 21 is a flat plate-like member incorporating the resistor 23 and the capacitor 24 for attaching the oscillation suppressing circuit 20 to the housing 10 from the outside of the housing 10, and, for example, Direct Copper Bonding (DCB) substrates, Active Metal Brazing (AMB) substrates and the like as well as print substrates can be adopted for this. The additional substrate 21 is configured such that insulating ceramic such as, for example, an aluminum nitride, silicon nitride, and aluminum oxide is formed in a plate-like shape, and then three mutually separated wiring patterns 22a to 22c of conductive metal such as, for example, copper, aluminum and the like are provided on the surface. The additional substrate 21 has through-holes (not shown) formed on both the left side and right side of the figure for inserting the bolts 17c and 18c as an example of fittings.

The resistor 23 is a resistor element for consuming electric power of high frequency noise output by the semiconductor device 100. In this embodiment, the resistor 23 is configured by connecting two resistor elements 23a and 23b in parallel and the both ends of the resistor elements 23a and 23b are connected to the wiring patterns 22a and 22b of the additional substrate 21, respectively. For the resistor 23 here, i.e., the resistor elements 23a and 23b, a resilient resistance material may be formed in at least an infinitesimally deformable shape, for example, a U-shape in a view from the side, and then the both ends may be connected to different wiring patterns, respectively. Occurrences of heat stress due to transient flows of large current in the semiconductor device 100 or occurrences of magnetic field due to transient flows of large current in the conductive part in the semiconductor device 100 or in the conductive part connected to the semiconductor device 100 may apply stress to the external terminals 16 to 18 to which the oscillation suppressing circuit 20 is connected. The resilient resistor 23 can deform flexibly in response to mechanical vibrations of the additional substrate 21 and absorb the vibrations thereby maintaining good bonding of the resistor elements 23a and 23b to the additional substrate 21, for example, thus improving reliability of the oscillation suppressing circuit 20 against mechanical vibrations.

The capacitor 24 is a capacitance element for absorbing high frequency noise electric power output by the semiconductor device 100. The capacitor 24 is connected between the wiring patterns 22b and 22c of the additional substrate 21 and serially connected to the resistor 23. The capacitor 24 here is formed using resilient dielectric such as film, paper and the like to be at least infinitesimally deformable. Accordingly, the capacitor 24 can deform flexibly in response to mechanical vibrations of the additional substrate 21 and absorb the vibrations thereby maintaining good bonding of the capacitor 24 to the additional substrate 21, for example, thus improving reliability of the oscillation suppressing circuit 20 against mechanical vibrations.

The capacitor 24 here has a capacitance of, for example, 100 nF, and more preferably, in the range of 1 nF to 20 nF. The resistor 23 has a resistance, for example, in the range of 1Ω to 10Ω. Accordingly, the oscillation suppressing circuit 20 suppresses voltage fluctuation in the range of 1 MHz to 100 MHz, and preferably, 10 MHz or more, and more preferably, in the range of 10 MHz to 20 MHz.

The oscillation suppressing circuit 20 is mounted onto the housing 10 where the upper surfaces of the external terminals 17 and 18 are exposed, i.e., the upper surfaces of the terminal housing sections $11c_2$ and $11c_3$. As described earlier, the oscillation suppressing circuit 20 is connected together with the conductive plate between the external terminals 17 and 18 by threading the bolts 17c and 18c, as an example of fittings, into the female threads of the terminals 17b and 18b housed in the terminal housing chamber 12 constituting the terminal housing sections $11c_2$ and $11c_3$, via rectangular-shaped washers 27 and 28, respectively and further through the through-holes (not shown) provided in the additional substrate 21, the conductive plate (not shown) for connecting the external terminals 17 and 18 to other semiconductor devices and the like, and the openings $17_0$ and $18_0$ of the external terminals 17 and 18, and then by screwing them. Accordingly, the wiring patterns 22a and 22c on the additional substrate 21 are connected to the external terminals 17 and 18 by the bolts 17c and 18c, respectively so that the resistor 23 and the capacitor 24 are serially connected between the external terminals 17 and 18.

Moreover, the oscillation suppressing circuit 20 may be mounted on one of the side surfaces in the vertical direction of the protrusion 11c of the housing 10 or the terminal housing chamber 12 constituting the terminal housing sections $11c_1$ to $11c_3$. In such a case, the oscillation suppressing circuit 20 may also be configured such that, for example, a horizontally extending recess is provided on a side surface of the protrusion 11c or the terminal housing chamber 12, and three wires that are connected to the external terminals 16 to 18 housed correspondingly to the terminal housing sections $11c_1$ to $11c_3$ in the recess 11b and the resistor element and the capacitance element that are connected serially between any two of the three wires are fitted into the horizontally extending recess.

The oscillation suppressing circuit 20 configured as described above and a fixing means such as bolts 17c and 18c, etc. for fixing the oscillation suppressing circuit 20 to the housing 10 enable the oscillation suppressing circuit 20 having appropriate resistance and capacitance respectively for the internal circuit of the semiconductor device 100 to be selected, and enable it to be detachably fixed on the terminal housing sections $11c_1$ to $11c_3$ of the housing 10 or a side surface of the terminal housing sections $11c_1$ to $11c_3$ or the protrusion 11c.

Figure 3B:
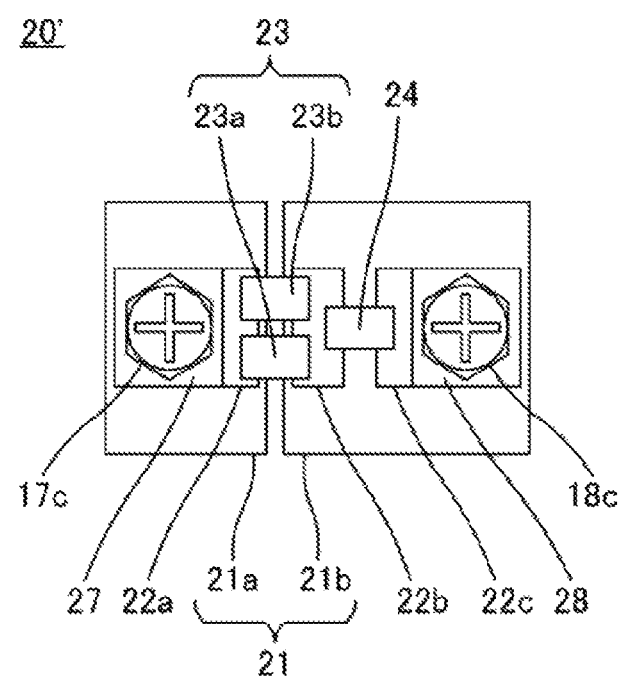
FIG. 3B shows a variation of the configuration of the oscillation suppressing circuit.

FIG. 3B shows a variation of the configuration of the oscillation suppressing circuit 20' in a view from the top. The oscillation suppressing circuit 20' has the additional substrate 21 (21a and 21b), resistor 23, and capacitor 24. For the same or corresponding parts of the constituent elements of the above-described oscillation suppressing circuit 20, the same reference symbols are given and the description thereof is not repeated here.

The additional substrate 21 includes a first portion substrate 21a and a second portion substrate 21b which are separated from each other. The first portion substrate 21a may be configured in the same manner with the additional substrate 21 of the oscillation suppressing circuit 20, but one wiring pattern 22a is provided on the front surface. Moreover, a through-hole (not shown) for inserting a bolt 17c as an example of fittings is formed thereon. The second portion substrate 21b may be configured in the same manner with the additional substrate 21 of the oscillation suppressing circuit 20, but two wiring patterns 22b and 22c which are separated from each other are provided on the front surface. Moreover, a through-hole (not shown) for inserting a bolt 18c as an example of fittings is formed thereon.

In this embodiment, the resistor 23 is configured by combining the two resistor elements 23a and 23b in parallel and the both ends of the resistor elements 23a and 23b are connected to the wiring pattern 22a of the first portion substrate 21a and the wiring pattern 22b of the second portion substrate 21b, respectively. For the resistor 23 here, i.e., the resistor elements 23a and 23b, a resilient resistance material is formed in at least an infinitesimally deformable shape, for example, U-shape in a view from the side, and then the resistor elements 23a and 23b are provided to straddle between the first portion substrate 21a and the second portion substrate 21b. Accordingly, the resistor 23 can deform flexibly in response to mechanical vibrations of the additional substrate 21, i.e., the first portion substrate 21a and the second portion substrate 21b, and absorb the vibrations thereby maintaining good bonding of the resistor elements 23a and 23b to the additional substrate 21, for example, thus improving reliability of the oscillation suppressing circuit 20' against mechanical vibrations.

The capacitor 24 is connected between the wiring patterns 22b and 22c of the second portion substrate 21b and serially connected to the resistor 23. The capacitor 24 here is formed using resilient dielectric such as film, paper and the like to be at least infinitesimally deformable. Accordingly the capacitor 24 can deform flexibly in response to mechanical vibrations of the additional substrate 21 and absorb the vibrations thereby maintaining good bonding of the capacitor 24 to the additional substrate 21, for example, thus improving reliability of the oscillation suppressing circuit 20' against mechanical vibrations.

Instead of providing the resistor 23 to straddle between the first portion substrate 21a and the second portion substrate 21b, the capacitor 24 may be provided to straddle between them. The oscillation suppressing circuit 20' may be used alternative to or with the oscillation suppressing circuit 20.

In the additional substrate 21, other than separating the first portion substrate 21a and the second portion substrate 21b from each other, a slit, for example, may be provided therebetween so as to partially separate them, and the resistor 23 and/or capacitor 24 may be provided to straddle between the partially separated first portion substrate 21a and the second portion substrate 21b.

Figure 4A:
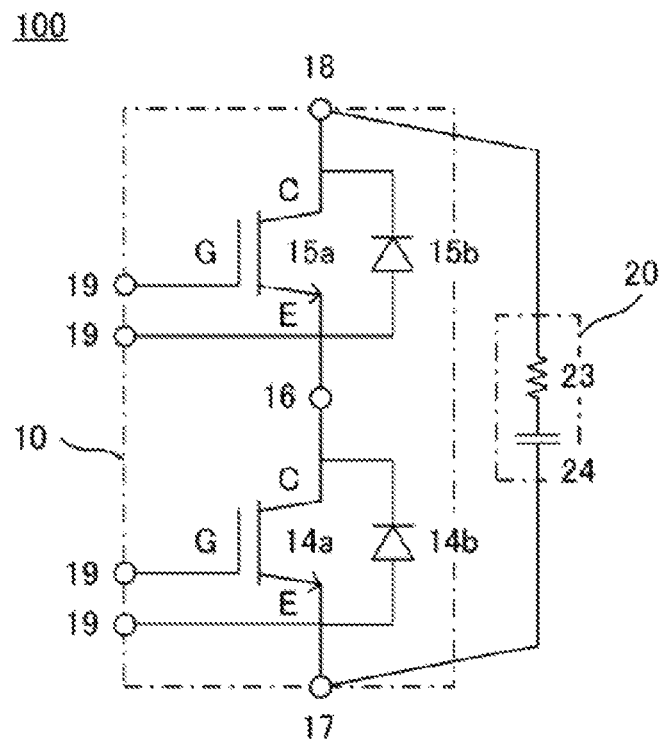
FIG. 4A shows a circuit configuration of the semiconductor device.

FIG. 4A shows a circuit configuration of the semiconductor device 100. The semiconductor elements 14a and 15a are serially connected between the external terminals 17 and 18 via the wiring patterns $13b_1$ to $13b_3$, the wires (not shown), and the conductive parts 17a and 18a. The SiC diode element 14b is connected in parallel to the semiconductor element 14a via the wiring pattern $13b_1$ and wires (not shown), and the SiC diode element 15b is connected in parallel to the semiconductor element 15a via the wiring pattern $13b_3$ and wires (not shown). Moreover, the oscillation suppressing circuit 20 is connected in parallel to the semiconductor elements 14a and 15a (as well as the SiC diode elements 14b and 15b) between the external terminals 17 and 18.

In the semiconductor device 100, the semiconductor elements 14a and 15a are turned on or off by being input control signals (switching signals contained inside) into the respective gate electrodes via the external terminal 19, the wiring pattern $13b_4$, and the wires (not shown) to supply or stop current from the external terminal 18 to the external terminal 16 or from the external terminal 16 to the external terminal 17. Moreover, the oscillation suppressing circuit 20 suppresses voltage fluctuation caused in the SiC diode element 14b in response to turn-ons of the semiconductor element 15a and/or voltage fluctuation (for example, high frequency noise) caused in the SiC diode element 15b in response to turn-ons of the semiconductor element 14a.

Not only one common oscillation suppressing circuit 20 may be provided for the semiconductor elements 14a and 15b (and the SiC diode elements 14b and 15b), but also separate oscillation suppressing circuits 20 may be provided to the respective semiconductor elements 14a (and the SiC diode element 14b) and 15a (and the SiC diode element 15b).

Figure 4B:
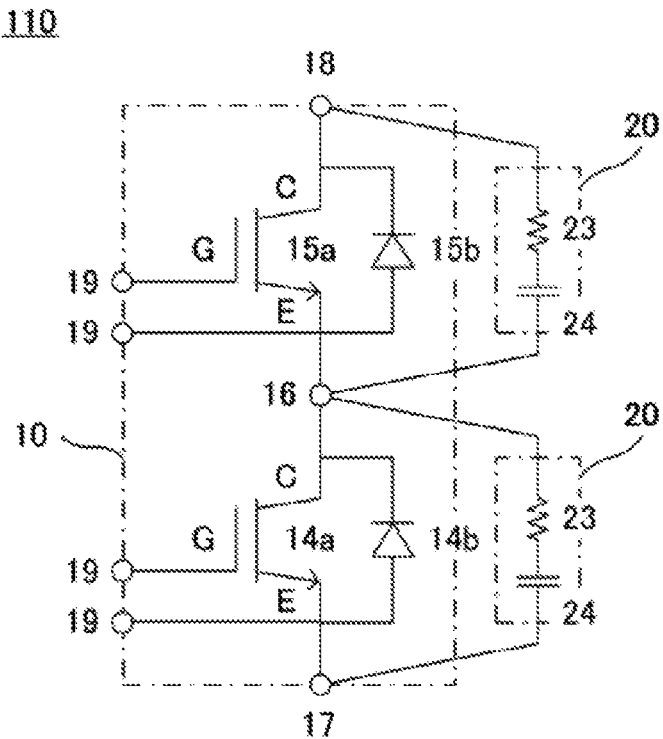
FIG. 4B shows the first variation of the circuit configuration of the semiconductor device.

FIG. 4B shows the first variation of the circuit configuration of the semiconductor device 110. Similar to the semiconductor device 100, the semiconductor elements 14a and 15a and the SiC diode elements 14b and 15b are connected between the external terminals 17 and 18. In contrast, one of the two oscillation suppressing circuits 20 is connected in parallel to the semiconductor element 14a (and the SiC diode element 14b) between the external terminals 16 and 17, and the other is connected in parallel to the semiconductor element 15a (and the SiC diode element 15b) between the external terminals 16 and 18.

In the semiconductor device 110, the oscillation suppressing circuit 20 connected between the external terminal 16 and the external terminal 17 suppresses voltage fluctuation caused in the SiC diode element 14b in response to turn-ons of the semiconductor element 15a, and the oscillation suppressing circuit 20 connected between the external terminal 16 and the external terminal 18 suppresses voltage fluctuation caused in the SiC diode element 15b in response to turn-ons of the semiconductor element 14a.

In the semiconductor device 110 according to the variation, the oscillation suppressing circuits 20 may be provided to each of the semiconductor element 14a (and the SiC diode element 14b) and the semiconductor element 15a (and the SiC diode element 15b), or the oscillation suppressing circuit 20 may be provided to only one of them.

Figure 5:
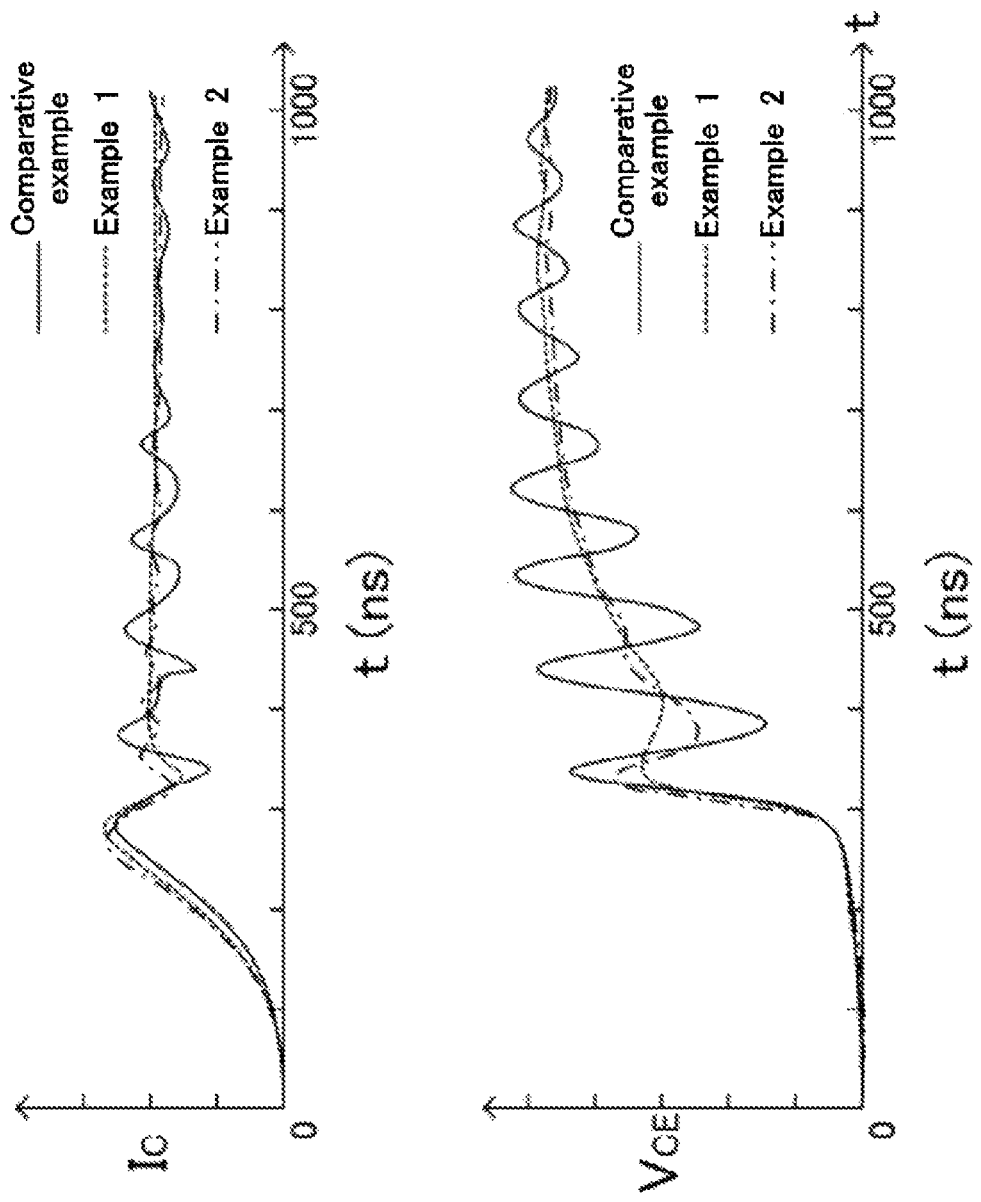
FIG. 5 shows transient changes of current and voltage during turn-ons.

The FIG. 5 shows the results of transient response test on current and voltage during turn-ons of the semiconductor device in the semiconductor devices 100 and 110. Here, in the oscillation suppressing circuit 20 of the semiconductor device 100, 2.5Ω of resistance for the resistor 23 and 11 nF of capacitance for the capacitor 24 were adopted. This shall be an Example 1. Moreover, in the oscillation suppressing circuit 20 of the semiconductor device 110, 6.8Ω of resistance for the resistor 23 and 5.2 nF of capacitance for the capacitor 24 were adopted. This shall be an Example 2. Furthermore, the semiconductor device 100 which does not include the oscillation suppressing circuit 20 shall be a Comparative example. In the transient response test, a wiring inductance was connected between the external terminals 16 and 18, and a voltage source was connected between the external terminals 17 and 18 in the semiconductor device 100 without the oscillation suppressing circuit 20 (Comparative example), the semiconductor device 100 (Example 1) and the semiconductor device 110 (Example 2), respectively. And transient response characteristics of the current $I_C$ being supplied to the semiconductor element 14a and being output from the external terminal 17 and the voltage $V_{CE}$ applied to between the external terminals 16 and 18 when turning on the semiconductor element 14a.

In Comparative example, when the semiconductor element 14a was turned on, the current $I_C$ increased progressively, showed the peak at approximately 280 ns and then turned to decrease, showed the clip at approximately 330 ns and then turned to increase again, showed the peak again at approximately 370 ns and then turned to decrease, and thereafter the current $I_C$ increased or decreased (i.e., oscillations) repeatedly at a cycle in the range of 80 ns to 100 ns and saturated. On the other hand, the voltage $V_{CE}$ surged from approximately 280 ns, showed the peak at approximately 320 ns and then turned to decrease, showed the clip at approximately 370 ns and turned to increase again, and showed the peak again at 430 ns and then turned to decrease, and thereafter the voltage $V_{CE}$ increased or decreased (i.e., oscillations in the range of 10 MHz to 12.5 MHz) repeatedly at a cycle of between 80 ns and 100 ns and saturated. Here, oscillations of the current $I_C$ and voltage $V_{CE}$ attenuated at approximately 1200 ns.

In Example 1, when the semiconductor element 14a was turned on, the current $I_C$ increased progressively, showed the peak at approximately 280 ns and then turned to decrease, showed the clip at approximately 330 ns and then turned to increase again, and became substantially constant at approximately 350 ns. On the other hand, the voltage $V_{CE}$ surged from approximately 280 ns, showed the peak at approximately 320 ns and then turned to decrease, showed the clip at approximately 380 ns and turned to increase again, and thereafter the voltage $V_{CE}$ increased progressively and saturated. Oscillations of the current $I_C$ and voltage $V_{CE}$ here was smaller than those of Comparative example 1 and attenuated at approximately 100 ns.

In Example 2, when the semiconductor element 14a was turned on, the current $I_C$ increased progressively, showed the peak at approximately 260 ns and then turned to decrease, showed the clip at approximately 315 ns and then turned to increase again, and showed the peak again at approximately 350 ns and then turned to decrease, and thereafter the current $I_C$ minutely increased or decreased (i.e., small oscillations) repeatedly at a short cycle of about 50 ns and saturated. On the other hand, the voltage $V_{CE}$ surged from approximately 280 ns, showed the peak at approximately 310 ns and then turned to decrease, showed the clip at approximately 370 ns and turned to increase again, and thereafter the voltage $V_{CE}$ minutely increased or decreased (i.e., small oscillations) repeatedly at a short cycle of about 50 ns and saturated. Oscillations of the current $I_C$ and voltage $V_{CE}$ here were smaller than those of Comparative example 1, but larger than those of Example 1, and attenuated at approximately 300 ns.

In the Example 1 and Example 2, very little loss of electric power by the oscillation suppressing circuit 20 could be confirmed.

From the above-described result of transient response test on current and voltage in response to turn-ons of the semiconductor device according to the semiconductor device 100 and the semiconductor device 110, it could be confirmed that the oscillation suppressing circuit 20 in both the semiconductor devices 100 and 110 could suppress high frequency current and voltage fluctuations during turn-ons of the semiconductor elements. In other words, the oscillation suppressing circuit 20 can suppress higher frequency (for example, between 10 MHz and 20 MHz) noise compared to the traditional RC snubber.

In the semiconductor device 100 according to this embodiment and the semiconductor device 110 according to the first variation, a RC snubber circuit may be connected in parallel to the oscillation suppressing circuit 20.

Figure 6A:
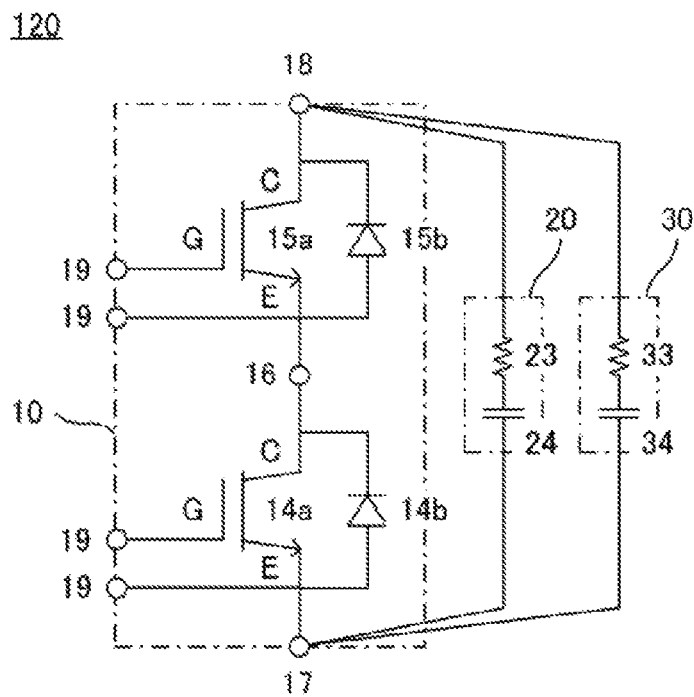
FIG. 6A shows the second variation of the circuit configuration of the semiconductor device.

FIG. 6A shows the second variation of the circuit configuration of the semiconductor device 120. Similar to the semiconductor device 100, the semiconductor elements 14a and 15a and the SiC diode elements 14b and 15b are connected between the external terminals 17 and 18, and the oscillation suppressing circuit 20 is connected in parallel to them between the external terminals 17 and 18. In contrast, an RC snubber circuit 30 is further connected in parallel to the oscillation suppressing circuit 20.

The RC snubber circuit 30 has a resistor 33 and capacitor 34 connected in series thereon. The capacitor 34 has a capacitance in the range of, for example, 400 nF to 10 µF. The resistor 33 has a resistance of, for example, 100Ω or more. Accordingly, the RC snubber circuit 30 absorbs surge voltage (Ldi/dt) caused in the wiring inductance (L) within the device due to sudden current change (di/dt) during turn-offs of the semiconductor element 14a or 15a. Compared to the RC snubber circuit 30, the ability of the above-described oscillation suppressing circuit 20 to absorb this surge voltage is lower.

Instead of the RC snubber circuit 30 having the resistor 33 and the capacitor 34 connected serially, a C bulk snubber circuit having only a capacitor may be used.

Figure 6B:
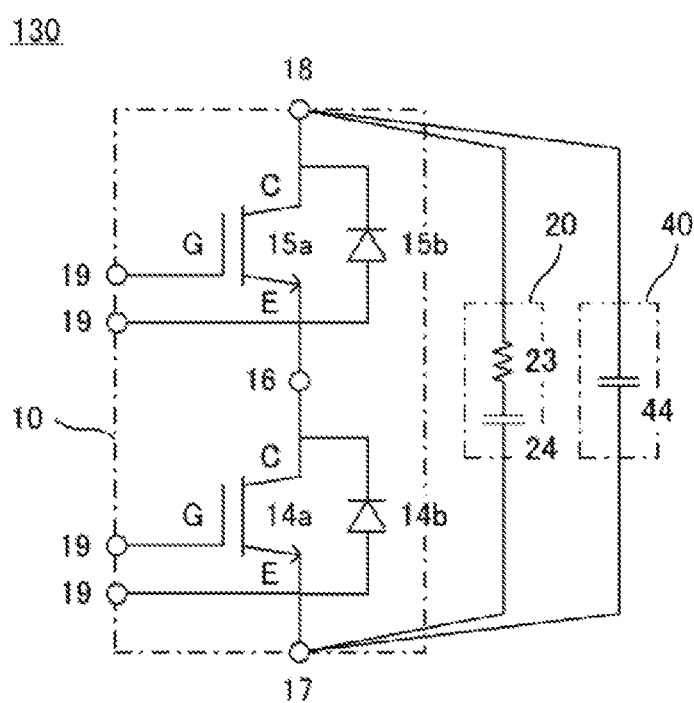
FIG. 6B shows the third variation of the circuit configuration of the semiconductor device.

FIG. 6B shows the third variation of the circuit configuration of the semiconductor device 130. Similar to the semiconductor device 100, the semiconductor elements 14a and 15a and the SiC diode elements 14b and 15b are connected between the external terminals 17 and 18, and the oscillation suppressing circuit 20 is connected in parallel to them between the external terminals 17 and 18. In contrast, a C bulk snubber circuit 40 is further connected in parallel to the oscillation suppressing circuit 20.

The C bulk snubber circuit 40 has a capacitor 44. The capacitor 44 has a capacitance in the range of, for example, 400 nF to 10 µF. Accordingly, similar to the RC snubber circuit 30, the C bulk snubber circuit 40 can absorb surge voltage applied to them during turn-offs of the semiconductor element 14a or 15a.

Figure 6C:
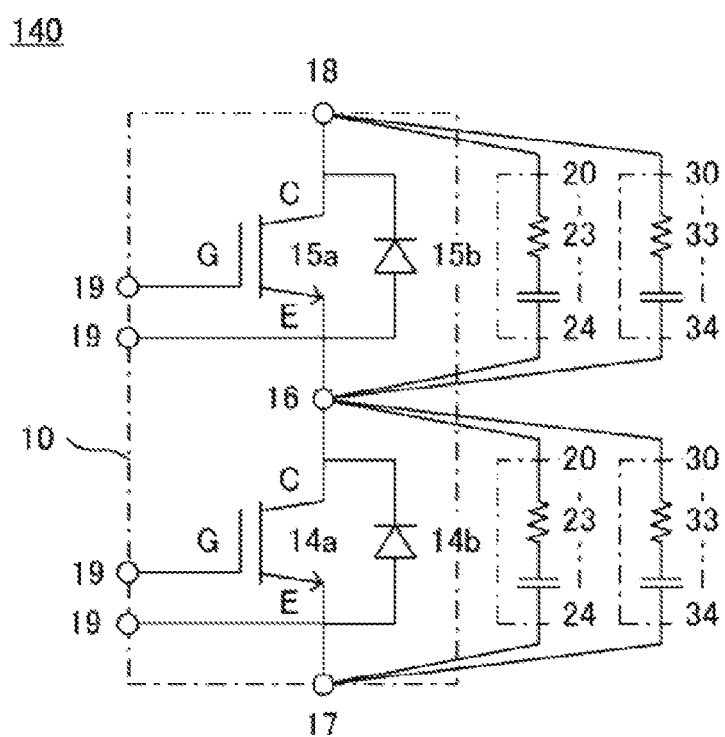
FIG. 6C shows the fourth variation of the circuit configuration of the semiconductor device.

FIG. 6C shows the fourth variation of the circuit configuration of the semiconductor device 140. Similar to the semiconductor device 110, the semiconductor elements 14a and 15a and the SiC diode elements 14b and 15b are connected between the external terminals 17 and 18, and one of the two oscillation suppressing circuits 20 is connected in parallel to the semiconductor element 14a (and the SiC diode element 14b) between the external terminals 16 and 17, and the other is connected in parallel to the semiconductor 15a (and the SiC diode element 15b) between the external terminals 16 and 18. In contrast, one of the two RC snubber circuits 30 is further connected in parallel to one of the oscillation suppressing circuits 20 between the external terminals 16 and 17, and the other of the two RC snubber circuits 30 is connected in parallel to the other oscillation suppressing circuit 20 between the external terminals 16 and 18.

The two RC snubber circuits 30 are configured similar to the RC snubber circuit 30 in the semiconductor device 120. In the semiconductor device 140, the RC snubber circuit 30 connected between the external terminals 16 and 17 absorbs surge voltage applied to the semiconductor element 14a during turn-offs of the semiconductor element 14a. The RC snubber circuit 30 connected between the external terminals 16 and 18 absorbs surge voltage applied to the semiconductor element 15a during turn-offs of the semiconductor element 15a.

In the semiconductor device 140 according to the fourth variation, instead of at least one of the two RC snubber circuits 30, the C bulk snubber circuit 40 may be used.

Although in the semiconductor device 100 according to this embodiment, the oscillation suppressing circuit 20 is fixed on the housing 10 (i.e., the terminal housing sections $11c_1$ to $11c_3$), instead of this, the oscillation suppressing circuit 20 may be incorporated in the substrate 13 in which the semiconductor elements 14a and 15a are mounted.

Although in the semiconductor device 100 according to this embodiment and in the semiconductor devices 110 to 140 according to the respective variations, the two semiconductor elements 14a and 15b are included, a plurality of the semiconductor elements 14a may be connected in series and/or in parallel between the external terminals 16 and 17 and a plurality of the semiconductor elements 15a may be connected in series and/or in parallel between the external terminals 16 and 18, for example. Similarly, a plurality of the SiC diode elements 14b may be connected in series and/or in parallel between the external terminals 16 and 17, and a plurality of the SiC diode elements 15b may be connected in series and/or in parallel between the external terminals 16 and 18.

Although the present invention has been explained by means of embodiments above, the technical scope of the present invention should not be restricted to the scope of the embodiments described above. It will be apparent to those skilled in the art that various modifications or improvements may be made to the embodiments. It will be apparent that such modifications and improvements shall fall into the technical scope of the present invention from the claims The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As apparent from the description above, the semiconductor device and the oscillation suppressing device can be achieved according to an embodiment of the present invention.

What is claimed is:

1. A semiconductor device comprising:
a first semiconductor element and a second semiconductor element connected in series;
a first SiC diode element connected in parallel to the first semiconductor element; and
a first oscillation suppressing circuit connected in parallel to the first semiconductor element and the first SiC diode element, the first oscillation suppressing circuit suppressing voltage fluctuation caused in the first SiC diode element in response to turn-ons of the second semiconductor element;
a second SiC diode element connected in parallel to the second semiconductor element;
a housing for housing the first semiconductor element, the second semiconductor element, the first SiC diode element, and the second SiC diode element, the housing comprising:
a first terminal housing section housing a first terminal to be connected to a fist external terminal, the first terminal being connected to the first semiconductor element at opposite side from the second semiconductor element, the first terminal housing section protruding from a main body part of the housing; and
a second terminal housing section housing a second terminal to be connected to a second external terminal, the second terminal being connected between the first semiconductor element and the second semiconductor element or the second terminal being connected to the second semiconductor element at opposite side from the first semiconductor element, the second terminal housing section protruding from the main body part of the housing;
wherein the first oscillation suppressing circuit includes a resistor and a capacitor connected in series and wherein at least one of the resistor and the capacitor is resilient,
wherein the first oscillation suppressing circuit includes an additional substrate to be attached to the housing from the outside of the housing, the additional substrate being formed of a non-conductive material,
wherein the additional substrate is fixed to the first terminal housing section and the second terminal housing section, and
wherein the additional substrate includes a first portion substrate and a second portion substrate separated from each other, and wherein the first oscillation suppressing circuit includes a resistor and a capacitor connected in series, at least one of the resistor and the capacitor being resilient and being provided to straddle between the first portion substrate and the second portion substrate.

2. The semiconductor device according to claim 1, wherein the first oscillation suppressing circuit suppresses a voltage fluctuation of 10 MHz or more.

3. The semiconductor device according to claim 2, wherein the first oscillation suppressing circuit suppresses a voltage fluctuation in a range of 1 MHz to 100 MHz.

4. The semiconductor device according to claim 1, wherein the capacitor has a capacitance of 100 nF or less.

5. The semiconductor device according to claim 4, wherein the capacitor has a capacitance in a range of 1 nF to 20 nF.

6. The semiconductor device according to claim 1, wherein the first oscillation suppressing circuit is mounted on surfaces in the first terminal housing section and the second terminal housing section, the surfaces where the first external terminal and the second external terminal are connected.

7. The semiconductor device according to claim 6, wherein the first oscillation suppressing circuit is screwed together with the first external terminal with respect to the first terminal in the first terminal housing section and is screwed together with the second external terminal with respect to the second terminal in the second terminal housing section.

8. The semiconductor device according to claim 1, wherein the first oscillation suppressing circuit is mounted on a side surface laterally positioned with respect to surfaces in the first terminal housing section and the second terminal housing section, the surfaces where the first external terminal and the second external terminal are connected.

9. The semiconductor device according to claim 1, wherein the first oscillation suppressing circuit is connected between a first terminal connected to the first semiconductor element at opposite side from the second semiconductor element and a second terminal connected between the first semiconductor element and the second semiconductor element.

10. The semiconductor device according to claim 9, further comprising a second oscillation suppressing circuit provided between a third terminal connected to the second semiconductor element at opposite side from the second terminal and the second terminal, the second oscillation suppressing circuit suppressing voltage fluctuation caused in the second SiC diode element in response to turn-ons of the first semiconductor element.

11. The semiconductor device according to claim 1, wherein the first oscillation suppressing circuit is provided between a first terminal connected to the first semiconductor element at opposite side from the second semiconductor element and a second terminal connected to the second semiconductor element at opposite side from the first semiconductor element.

12. The semiconductor device according to claim 1, further comprising an RC snubber circuit connected in parallel to the first semiconductor element, the first SiC diode element and the first oscillation suppressing circuit.

13. The semiconductor device according to claim 12, wherein the RC snubber circuit includes a capacitor having a capacitance in a range of 400 nF to 10 μF.

14. An oscillation suppressing device to be attached to a semiconductor device comprising a first and a second semiconductor elements connected in series and a first SiC diode element connected in parallel to the first semiconductor element, the oscillation suppressing device comprising:
- an oscillation suppressing circuit to be attached to a housing of the semiconductor device and connected in parallel to the first semiconductor element and the first SiC diode element, the oscillation suppressing circuit suppressing voltage fluctuation caused in the first SiC diode element in response to turn-ons of the second semiconductor element; and
- a second SiC diode element connected in parallel to the second semiconductor element,
- wherein the oscillation suppressing circuit includes a resistor and a capacitor connected in series,
- wherein at least one of the resistor and the capacitor is resilient,
- wherein the first oscillation suppressing circuit includes an additional substrate to be attached to the housing from the outside of the housing, the additional substrate being formed of a non-conductive material,
- wherein the additional substrate is fixed to the first terminal housing section and the second terminal housing section, and
- wherein the additional substrate includes a first portion substrate and a second portion substrate separated from each other, and wherein the first oscillation suppressing circuit includes a resistor and a capacitor connected in series, at least one of the resistor and the capacitor being resilient, and being provided to straddle between the first portion substrate and the second portion substrate.

15. The oscillation suppressing device according to claim 14, wherein the housing comprises
- a first terminal housing section housing a first terminal to be connected to a first external terminal, the first terminal being provided to the first semiconductor element at opposite side from the second semiconductor element, the first terminal housing section protruding from a main body part of the housing and
- a second terminal housing section housing a second terminal to be connected to a second external terminal, the second terminal being provided between the first semiconductor element and the second semiconductor element or the second terminal being provided to the second semiconductor element at opposite side from the first semiconductor element, the second terminal housing section protruding from the main body part of the housing, wherein the oscillation suppressing device is mounted on surfaces in the first terminal housing section and the second terminal housing section, the surfaces where the first external terminal and the second external terminal are connected or a side surface laterally positioned with respect to surfaces in the first terminal housing section and the second terminal housing section, the surfaces where the first external terminal and the second external terminal are connected.

* * * * *